(12) United States Patent
Mueller et al.

(10) Patent No.: US 8,883,546 B2
(45) Date of Patent: Nov. 11, 2014

(54) PROCESS FOR PREPARING AN ORGANIC ELECTRONIC DEVICE

(75) Inventors: David Christoph Mueller, Frankfurt am Main (DE); Toby Cull, Romsey (GB); Pawel Miskiewicz, Cambridge, MA (US); Miguel Carrasco-Orozco, Winchester (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/820,318

(22) PCT Filed: Aug. 5, 2011

(86) PCT No.: PCT/EP2011/003950
§ 371 (c)(1),
(2), (4) Date: Mar. 1, 2013

(87) PCT Pub. No.: WO2012/028244
PCT Pub. Date: Mar. 8, 2012

(65) Prior Publication Data
US 2013/0153885 A1    Jun. 20, 2013

(30) Foreign Application Priority Data
Sep. 2, 2010   (EP) ..................................... 10009116

(51) Int. Cl.
*H01L 21/00*     (2006.01)
*H01L 51/05*     (2006.01)
*H01L 51/00*     (2006.01)

(52) U.S. Cl.
CPC .......... *H01L 51/0004* (2013.01); *H01L 51/052* (2013.01); *H01L 51/0012* (2013.01); *H01L 51/0512* (2013.01); *H01L 51/0026* (2013.01); *H01L 51/0096* (2013.01); *H01L 51/0541* (2013.01); *H01L 51/0545* (2013.01); *H01L 51/0003* (2013.01)
USPC .................................. 438/82; 438/99; 257/40

(58) Field of Classification Search
USPC ......................................... 257/40; 438/82, 99
See application file for complete search history.

(56) References Cited

U.S. PATENT DOCUMENTS

| 7,250,710 B2 | 7/2007 | Gilmour et al. |
| 7,279,777 B2 * | 10/2007 | Bai et al. ........................ 257/642 |
| 2004/0263060 A1 | 12/2004 | Gilmour et al. |
| 2007/0096088 A1 | 5/2007 | Tano et al. |
| 2009/0206328 A1 * | 8/2009 | Matsukawa et al. ............ 257/40 |

FOREIGN PATENT DOCUMENTS

| GB | 2403023 A | 12/2004 |
| JP | 2007-256782 A | 10/2007 |
| WO | 2004/102690 A2 | 11/2004 |

OTHER PUBLICATIONS

International Search Report for PCT/EP2011/003950 (Dec. 21, 2011).
International Preliminary Report on Patentability for PCT/EP2011/003950 (Mar. 5, 2013).
K. Eiroma et al., "UV Curing for Printed Electronics", Technical Paper, Radtech Report (Sep./Oct. 2007) pp. 31-34.

(Continued)

*Primary Examiner* — Phat X Cao
(74) *Attorney, Agent, or Firm* — Millen, White, Zelano & Branigan, P.C.

(57) ABSTRACT

The present invention relates to a process for preparing improved electronic devices, in particular organic field effect transistors (OFETs), with patterned insulator and organic semiconductor layers.

22 Claims, 11 Drawing Sheets

(56) References Cited

OTHER PUBLICATIONS

C.R. Kagan et al., "Patterning Organic-Inorganic Thin-Film Transistors Using Microcontact Printed Templates", Applied Physics Letters, vol. 79, No. 21 (Nov. 19, 2001) pp. 3536-3538.

C. Kim et al., "Pentacene Transistors Fabricated on Photocurable Polymer Gate Dielectrics: Tuning Surface Viscoelasticity and Device Response", Advanced Materials, vol. 21 (2009) pp. 1-5.

Patent Abstracts of Japan for JP 2007-256782 A (Oct. 4, 2007).

* cited by examiner

PROCESS FOR PREPARING AN ORGANIC ELECTRONIC DEVICE

The present invention relates to a process for preparing improved electronic devices, in particular organic field effect transistors (OFETs), with patterned insulator and organic semiconductor layers.

BACKGROUND OF THE INVENTION

Organic field effect transistors (OFETs) are used in display devices and logic capable circuits. For many display applications a high on/off ratio is required so that sufficient contrast and a reliable dynamic operation is obtained. Improvements in the on/off ratio have been achieved in the past by patterning of the organic semiconductor (OSC) layer to reduce parasitic leakage currents, as disclosed for example in U.S. Pat. No. 5,854,139. The semiconductor layer may be patterned by conventional lithography using an etching step to remove the layer from unwanted areas. Such techniques are well established in inorganic electronics. However, organic semiconductors (OSC) are often not easily processed by etching. For example the OSC layer may be deposited by inkjet on active areas only. U.S. Pat. No. 5,854,139 discusses patterning an oligothiophene OSC by illuminating the OSC layer through an optical mask.

WO 2006/048092 A1 suggests a process for patterning the OSC layer by applying an oxidizing agent to the OSC layer outside the channel areas, and reports that this leads to an improved on/off ratio.

Another method reported for patterning the OSC layer suggested in prior art is based on varying the surface energy (wettability) of the surface around a transistor device. This concept of directing or confining a deposited drop via a surface energy gradient is a well known principle and is reported as being especially suitable for inkjet printing processes, as described for example in Appl. Phys. Lett. 79, 3536 (2001).

However, the methods described in prior art do still leave room for further improvements.

It is therefore an aim of the present invention to provide methods for manufacturing improved organic electronic (OE) devices, in particular bottom gate (BG) OFETs. In particular, it is an aim to improve the on/off ratio in an OFET and maintain the mobility of the layer in the channel area whilst reducing the mobility in other areas. The method should not have the drawbacks of prior art methods and allow time-, cost- and material-effective production of electronic devices at large scale. Other aims of the present invention are immediately evident to the expert from the following

DETAILED DESCRIPTION

It was found that these aims can be achieved by providing a method as claimed in the present invention. In particular it was found that it is possible to provide an OSC layer with a crystallization pattern, comprising regions having a high degree of crystallinity that exhibit high charge carrier mobility and regions having a low degree of crystallinity or even being amorphous that exhibit low charge carrier mobility. This can be simply achieved by providing an insulator layer onto which the OSC layer is subsequently applied, wherein the insulator layer contains a cross-linkable material, and wherein the cross-linking density in specific regions can be varied for example by UV irradiation through a shadow mask. Coating the processed insulator layer with an OSC formulation results in the formation of OSC crystals on the surface of the insulator layer only in regions which have been subjected to increased UV irradiation. On the other regions of the insulator layer the coated OSC will be amorphous or have a lower degree of crystallinity.

Methods of using UV irradiation to achieve a patterning of the insulator layer are known in prior art. However, these methods usually apply strong UV radiation and are mostly based on affecting quite drastic photo-induced chemical reactions at the surface of the insulator layer, which result in a significant change of the surface free energy. However, this does often lead to a degradation of the insulating property. In order to reduce the damage of the insulator layer caused by the UV radiation, US 2007/0096088 A1 suggests to apply an additional wettability control layer including a material whose surface energy can be changed by UV radiation and which is transmissive for UV radiation. However, the use of additional layers will increase the device and process costs.

SUMMARY OF THE INVENTION

The invention relates to a process of preparing an organic electronic (OE) device, comprising the steps of
  depositing an insulator layer comprising a cross-linkable dielectric material onto a substrate or onto another layer of said OE device,
  exposing one or more areas of the insulator layer to a first radiation dosage, or to a first thermal energy, that causes partial but not complete cross-linking of the dielectric material,
  exposing one or more, but not all, areas of the insulator layer to a second radiation dosage, or to a second thermal energy, that causes a higher degree of cross-linking of the dielectric material than the exposure to the first radiation dosage or the first thermal energy,
  wherein the sequence of the two exposure steps can also be reversed,
  depositing an organic semiconductor (OSC) layer onto at least a part of the insulator layer,
so that the OSC layer is in direct contact with at least a part of the areas of the insulator layer having a higher degree of cross-linking of the dielectric material.

In a preferred embodiment the process comprises, before the first exposure step, the step of partially cross-linking the dielectric material in one or more, but not all, areas of the insulator layer, thereby providing a pattern of areas that are cross-linked and areas that are not cross-linked, wherein the cross-linking of the dielectric material is preferably sufficient to provide solvent resistance. The process according to this preferred embodiment further comprises, after the first and second exposure steps, the step of removing any remaining dielectric material that was not cross-linked in the previous steps, for example by a solvent rinse.

The invention further relates to an organic electronic (OE) device obtainable or obtained by a process as described above and below, preferably a top gate or bottom gate organic field effect transistor (OFET), very preferably preferably a bottom gate OFET.

Preferably the OE device is selected from the group consisting of organic field effect transistors (OFET), thin film transistors (TFT), components of integrated circuitry (IC), radio frequency identification (RFID) tags, organic light emitting diodes (OLED), electroluminescent displays, flat panel displays, backlights, photodetectors, sensors, logic circuits, memory elements, capacitors, organic photovoltaic (OPV) cells, charge injection layers, Schottky diodes, planarising layers, antistatic films, conducting substrates or patterns, photoconductors, photoreceptors, electrophotographic devices and xerographic devices.

DETAILED DESCRIPTION OF THE INVENTION

Figure 1A:
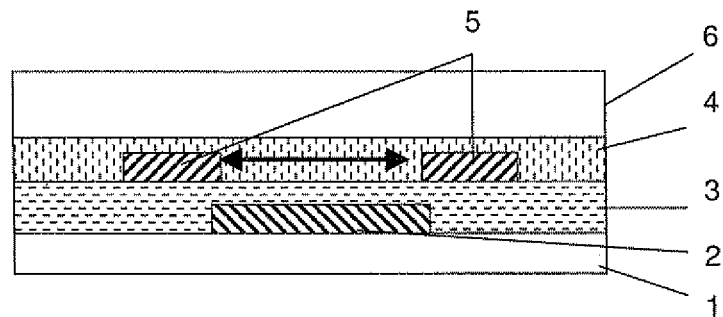
FIG. 1A schematically depicts a typical bottom gate, bottom contact OFET of prior art.

The terms "dielectric" and "insulating" or "insulator" are used above and below interchangeably. Thus reference to an insulator layer also includes a dielectric layer and vice versa.

The term "interlayer" means a layer in an organic electronic device which is provided between two other functional layers or components of the device, for example between the gate insulator layer and the gate electrode, or between the gate insulator layer and the semiconductor layer.

The area between the source electrode and the drain electrode, which is being covered by or being superposed to a gate electrode in an OFET device, is also referred to as the "channel area".

The term "polymer" generally means a molecule of high relative molecular mass, the structure of which essentially comprises the multiple repetition of units derived, actually or conceptually, from molecules of low relative molecular mass (see Pure Appl. Chem., 1996, 68, 2289).

The term "repeating unit" or "monomeric unit" means the constitutional repeating unit (CRU), which is the smallest constitutional unit the repetition of which a regular macromolecule, a regular oligomer molecule, a regular block or a regular chain (see Pure Appl. Chem., 1996, 68, 2291).

The terms "radiation" and "photoradiation" should be understood to include any type radiation of a specific wavelength or wavelength range that may be used to induce a cross-linking reaction in a cross-linkable material according to the present invention, for example UV radiation. Preferably a cross-linkable material according to the present invention is cross-linkable by exposure to UV radiation, and the photoradiation used in the process of the present invention is UV radiation. However, any embodiment of a process as described above and below which refers to UV radiation may also be adapted to another type of photoradiation, for example radiation with a wavelength in the visible or infrared (IR) range, depending on the type of cross-linkable materials used.

The term "radiation dosage" means the amount of radiation power (W) over a given area ($cm^2$) applied to a sample for a given time (s). The dosage is given in units of $J/cm^2$ and is usually defined for a specific wavelength or over a specific range of wavelengths.

In the foregoing and the following, the terms "area" and "region" are used interchangeably to describe a certain part of a device layer like the insulator layer or the OSC layer.

The process according to the present invention preferably uses materials based on cross-linking, like for example [2+2] cross-linking, which may be photoinduced or thermally induced or a combination of both, as insulators, in particular as organic gate insulator (OGI), in an OE device, preferably an OFET, very preferably an OFET with bottom gate (BG) configuration. The cross-linking density in specific regions of the insulator layer can be varied by irradiation through a shadow mask, so that different regions are exposed to different radiation dosages.

As a result of the process according to the present invention, the insulator layer exhibits a pattern of regions that have been exposed only to the first or second radiation dosage and regions that have been exposed both to the first and the second radiation dosage.

Coating the processed and patterned insulator layer with a spin coated OSC formulation will then result in the formation of crystals of the OSC material on the surface of the insulator only in regions which have been exposed to an increased UV radiation dosage. In contrast thereto, on the other regions of the insulator layer, which have been exposed to lower radiation dosage, it is observed that the coated OSC material forms an amorphous or less crystalline layer.

In contrast to the prior art methods, the method of creating an OSC layer with a crystallisation pattern according to the present invention is not based on changing the surface energy by photoirradiation, as disclosed for example in US 2007/0096088 A1. Also, the surface energy does not change significantly and there is no new surface chemistry introduced.

Without wishing to be bound to a specific theory, the inventors of the present invention believe that the patterned crystallisation observed in the OSC layer as described above and below is related to the cross-linking density of the insulator layer onto which the OSC layer is deposited. A certain hardness is required for OSC crystals to be formed on the surface of the insulator, hereby the hardness is linked to the cross-linking density.

The corresponding cross-linking density $R_c$ where crystals begin to form is significantly higher than the cross-linking density $R_s$ necessary to achieve insolubility of the insulator. For cross-linking densities higher than $R_s$ but lower $R_c$ the coated OSC formulations are resulting in amorphous non-crystalline films.

In case of cross-linkable polymeric insulator materials, based e.g. on 2+2-coupling chemistry (or other bimolecular cross-linking reactions), the cross-linking density can be easily controlled by the amount of incident photons (e.g. the radiation dosage) provided to the system. This is also due to the fact that the cross-linking chemistry is preferably based on individual and nearly independent bi-molecular 2+2 coupling reactions without any self-propagating effect and not on a chain reaction.

The inventors of the present invention do further believe that the formation of OSC crystals is linked to the amount of swelling and/or penetration of the insulator layer surface by the OSC formulation deposited onto the OGI layer in a subsequent device manufacturing step.

The process according to the present invention can be advantageously used for example to decrease the off-current in OFET devices, especially BG OFETs, by confining OSC crystal formation solely to the channel area. This allows area-coating techniques such as spin coating to recreate the low off-currents of patterned deposition methods such as IJP. Additionally it can be used in combination with other patterning methods to increase resolution for example of flexographic printing. Thereby the resolution of those printing techniques will be lower than the transistor feature sizes, so that the process of the present invention can also be used for fine-tuning and/or improving positional accuracy. Therefore, it may be that no further layers, such as bank structures, are needed.

As mentioned above, one significant difference between the process according to the present invention and the processes described in prior art is the effect of the photoirradiation. In prior art UV irradiation usually enables positional patterning of the subsequent OSC layer (e.g. by solvent based deposition, usually using ink-jet printing) by varying the surface energy (or wettability) of the surface around a transistor device. This concept of directing or confining a deposited drop via a surface energy gradient is a well known principle and is described for example in Appl. Phys. Lett. 79, 3536 (2001).

In contrast thereto, in the process according to the present invention the wettability/surface energy of the substrate, i.e. the OGI, itself is not significantly affected by the photoradiation, as the irradiation does not lead to any chemical change except for the intended cross-linking reaction. Instead, the effect of the different radiation dosages is to produce regions with different cross-linking density of the insulator. Thereby, a soft, but solvent resistant region, which is "OSC non-crystallisation inducing", and a hard region, which is "OSC crystallisation inducing", are formed in the insulator layer.

In particular when using small molecule OSC materials, like for example substituted pentacenes or anthra-dithiophenes as described e.g. in U.S. Pat. Nos. 6,690,029, 7,385,221, WO 2005/055248 A2 or WO 2008/107089 A1, due to the extremely low electrical performance of the non-crystalline, amorphous OSC layers these amorphous regions do not contribute/disrupt the electrical characteristics of the transistor device. Instead, the transistor characteristics are mainly determined by the hard cured regions with crystalline OSC morphology. As a result the transistor performance is very similar to that of a device obtained by physical patterning of the OGI and/or OSC layer.

Also, in the process according to the present invention the OSC is deposited over the whole area of the device and not physically patterned by depositing the OSC only into the active transistor device area. The process can thus be described as "simulated" patterning, and is especially advantageous for low-resolution printing methods like e.g. flexoprinting or gravure-printing, where large areas are covered by the OSC, and where surface energy induced patterning concepts are not efficient in confining the relatively high amount of ink deposited.

The method according to the present invention provides further advantages. For example, in ink-jet printing, if a drop is deposited into the channel it is usually larger than the channel region if no bank structure is used. When using the patterning method according to the present invention, the channel areas can be defined as the crystallisation area, and therefore, although the drop still covers a large region, crystallisation will only take place in the patterned channel region. This can lead to improved crystal morphology in devices prepared by ink-jet printing, and can eliminate at least some of the detrimental morphologies seen when ink-jetted drops undergo the so-called "coffee stain effect".

Another advantage is that a low resolution process such as flexoprinting can be used to create high resolution patterned channels, without the complexity of removing the OSC material, or the cost of a higher resolution technique.

Such a process of patterning based on the hardness/cross-linking density or the swelling coefficient of the polymer insulator has not been described in prior art.

Some preferred features of a process according to the present invention, and its difference compared to a prior art process, are listed below:

- all parts of the insulator layer are exposed to photoradiation, but higher radiation dosages are applied to specific regions of the insulator layer, where crystallisation of the OSC deposited onto the insulator layer is desired,
- some areas of the insulator layer are not exposed to photoradiation, and are then developed at the end of the patterning process of the insulator layer, for example by removing the uncrosslinked dielectric material using a solvent rinse. This method is suitable to create vias through the dielectric material such that electrical contact can be made,
- in the first irradiation step the radiation dosage is selected such that the cross-linking reaction in the cross-linkable dielectric material is only partial, i.e. not complete,
- in the second irradiation step some of the partially cross-linked areas of the insulator layer are further cross-linked or fully cross-linked, wherein full cross-linking may also be achieved by subsequent annealing of the insulator layer,
- the cross-linking density in the insulator layer is varied, yielding varying degrees of hardness and swelling coefficient in different areas of the insulator layer, which results in different degrees of crystallization of the OSC deposited on the respective different areas of the insulator layer,
- the areas of the insulator layer to which a higher radiation dosage is applied (i.e. two dosages in two steps) are the areas intended for a high crystallinity and high performance of the OSC deposited onto the insulator layer (i.e. opposite to the prior art concepts described above),
- apart from the cross-linking reaction of the dielectric material of the insulator layer, preferably no further chemical reactions and/or novel groups are formed at the surface of the insulator layer,
- the polarity of the surface and the permittivity of the dielectric material of the insulator layer is preferably not changed to any significant extent during the process according to the present invention (a possible change in the surface energy of the insulator layer by applying varying radiation dosages is not intended, however minor changes in the surface energy are not excluded),
- the process is used for large area printing methods (where a physical patterning based on surface energy induced effects is not feasible or practical). Thereby a higher resolution of patterning can be achieved than that acheviable by the deposition technique itself.

In another preferred embodiment of the present invention, the first radiation exposure step is substituted by a thermal annealing step (in case the dielectric material is a thermally curable material) to partially cross-link the dielectric material. The second radiation step is then carried out by using photo-irradiation in the case of a dual photocurable/thermal curable system, or by using a laser to thermally pattern the substrate (in case the material is only thermally curable).

In another preferred embodiment of the present invention, the procedure of exposure to a first radiation dosage for partial cross-linking and then to a second dose for further/full cross-linking of the dielectric material is reversed. For example, in the first exposure step the radiation dosage is provided through a shadow mask, and induces complete or partial cross-linking of the unmasked (i.e. exposed) dielectric material. In the second exposure step the radiation dosage is lower than in the first exposure step, and is for example a flood irradiation, to cross-link and thus insolubilise the areas that were masked in the first exposure step.

The terms "partial cross-linking" and "partially cross-linked" as used above and below mean that not all, but only a portion, of the cross-linkable moieties in the cross-linkable dielectric material will react by a cross-linking reaction, for example upon exposure to a first radiation dosage. "Further cross-linking" or "higher degree of cross-linking" means that at least some of the cross-linkable moieties, which have not reacted in the previous irradiation step, will react by a cross-linking reaction for example in a subsequent irradiation step and/or in an annealing step.

Preferably the process according to the present invention comprises the following steps
a) depositing a gate electrode for example of Al, onto a substrate, for example by evaporation,
b) depositing an insulator layer comprising a cross-linkable dielectric material onto the gate electrode and/or the substrate, for example by spin coating, optionally followed by annealing the dielectric material,
b1) optionally patterning the insulator layer to leave areas that contain cross-linked dielectric material and areas that do not contain cross-linked dielectric material, wherein the degree of cross-linking of the dielectric material is sufficient to provide solvent resistance, preferably by exposing the insulator layer to photoradiation through a photomask or shadow mask or by exposing the insulator layer to thermal energy using a thermal laser to heat only selected areas,
c) exposing the insulator layer to a first radiation dosage or first thermal energy that causes cross-linking of the cross-linkable dielectric material (which has not yet been cross-linked in step b1), preferably by exposing the entire insulator layer, and preferably without exposing different parts of the insulator layer to different radiation dosages, thereby inducing a cross-linking reaction in the cross-linkable dielectric material, wherein the radiation dosage or thermal energy is selected such that the cross-linking reaction is only partial but not complete,
d) exposing some, but not all areas of the insulator layer to a second radiation dosage or a second thermal energy that causes a higher degree of cross-linking of the cross-linkable dielectric material material than in step c), preferably by photoirradiation through a photomask or shadow mask or by using a thermal laser, wherein the exposed areas are those areas where a crystalline OSC material in a subsequently superposed OSC layer is desired, preferably the channel area, as a result of which the insulator layer exhibits areas of high and low cross-linking density,
d1) optionally removing any remaining dielectric material that was not cross-linked in the previous steps, for example by a solvent rinse,
e) depositing source and drain electrodes, for example of Au or Ag, for example by evaporation, onto the insulator layer,
f) depositing an OSC layer onto the source and drain electrodes and the insulator layer, for example by spin coating, optionally followed by annealing the OSC layer,
wherein optionally step d) is carried out before step c), and/or optionally step f) is carried out before step e), and
wherein the area between the source electrode and the drain electrode is the channel area, and the OSC layer is in direct contact with the insulator layer at least in the channel area or at least in an area that is entirely superposed by the channel area.

When preparing a BG, bottom contact OFET, the source and drain electrodes are deposited on to OGI layer before the OSC layer, so that steps e) and f) are carried out in the sequence as described above.

When preparing a BG, top contact OFET, the OSC layer is deposited onto the OGI layer before the source and drain electrodes. In this case in the process according to the present invention as described above and below step f) is carried out before step e).

OSC crystals are then formed in step f) mainly (preferably only) on those regions of the insulator surface where the insulator material was exposed to the second radiation dosage in step d), and consequently has an increased cross-linking density. On other regions of the insulator surface the OSC material is amorphous or has lower crystallinity.

The exact process conditions can be easily adopted and optimised to the corresponding insulator and OSC materials used. For example, preferably a step of cleaning the substrate is carried out before step a) and a surface treatment can be applied to increase adhesion between the substrate and insulator layer can be applied.

FIG. 1A is a schematic representation of a typical BG, bottom contact OFET according to prior art, including a gate electrode (2) provided on a substrate (1), a layer of dielectric material (3) (gate insulator layer), source (S) and drain (D) electrodes (5), a layer of OSC material (4), and an optional second insulator or protection layer (6) to shield or protect the OSC layer and the S/D electrodes from further layers or devices that may be later provided thereon or from environmental influence. The distance between the source and drain electrodes (5), as indicated by the double arrow, is the channel area.

Figure 1B:
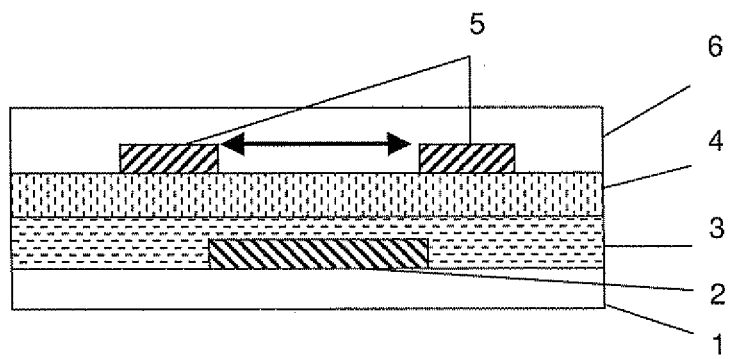
FIG. 1B schematically depicts a typical bottom gate, top contact OFET of prior art.

FIG. 1B is a schematic representation of a typical BG, top contact OFET according to prior art, including a gate electrode (2) provided on a substrate (1), a layer of dielectric material (3) (gate insulator layer), a layer of OSC material (4), source (S) and drain (D) electrodes (5), and an optional protection layer (6) to shield or protect the OSC layer and the S/D electrodes from further layers or from environmental influence.

Figure 2:
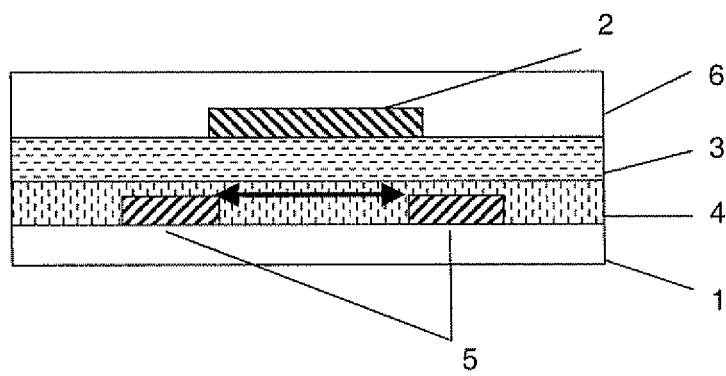
FIG. 2 schematically depicts a typical top gate OFET of prior art.

FIG. 2 is a schematic representation of a typical TG OFET according to prior art, including source and drain electrodes (5) provided on a substrate (1), a layer of OSC material (4), a layer of dielectric material (3) (gate insulator layer), a gate electrode (5), and an optional second insulator or protection layer (6) to shield the gate electrode from further layers or devices that may be later provided.

Figure 3A:
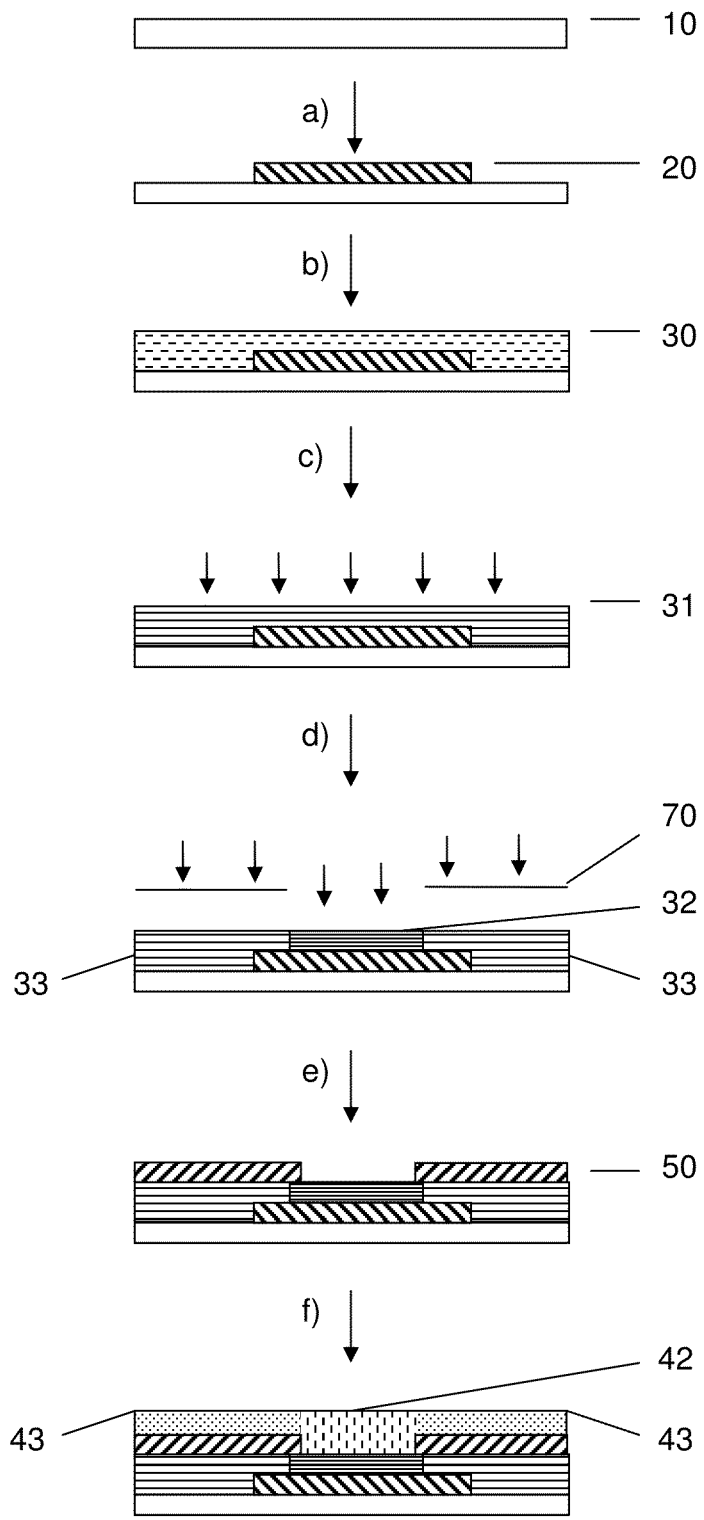
FIG. 3A exemplarily and schematically depicts a process for preparing a bottom gate, bottom contact OFET according to the present invention.

FIG. 3A exemplarily and schematically illustrates a process for preparing a bottom gate, bottom contact OFET device in accordance with the present invention. For sake of simplicity, the reference numbers of a layer provided in a single step as shown in FIG. 3A are not always displayed in the next step.

In a first step a) a gate electrode (20) is deposited onto a substrate (10), the surface of which has preferably been cleaned before depositing the gate electrode.

In the next step b) a layer of cross-linkable dielectric material (30) is deposited onto the gate electrode to serve as gate insulator layer.

It is also possible to carry out a photo-patterning step b1) wherein the dielectric material is masked and subjected to photoradiation, so that only the unmasked parts are cross-linked. Any remaining parts of the masked dielectric material in this step, which are also not subjected to the two radiation doses in the next steps c) and d), can then later be removed by a developing process, for example by a solvent rinse.

It is also possible to carry out additional photo-patterning wherein the dielectric material is completely masked from the two radiation doses in the next steps c) and d) so that only the unmasked parts are cross-linked. Any parts of the masked dielectric material following these steps, which are not subjected to the two radiation doses, can then later be removed by a developing process, for example washing by a solvent rinse.

In the next step c) the dielectric material (30) is exposed to a first radiation dosage (indicated by the arrows) that induces cross-linking in the dielectric material, but wherein the radiation dosage is selected such that the cross-linking reaction is not complete, resulting in a partially cross-linked gate insulator layer (31).

In the next step d) the gate insulator layer containing the partially cross-linked dielectric material (31) is covered by a photomask or shadow mask (70) and is then exposed to a second radiation dosage (indicated by the arrows). The photomask (70) has a pattern of regions which are transmissive to the radiation (for example holes in the mask) and regions which are non-transmissive or only partially transmissive to the radiation. As a result, only selected regions of the partially cross-linked dielectric layer (31) are fully exposed to the second radiation dosage, whereas other regions are not or only partially exposed to the second radiation dosage. The second radiation dosage induces further cross-linking in the fully exposed regions of the dielectric material (32), leading to a higher cross-linking density, as compared to the not or only partially exposed regions of the dielectric material (33).

It is also possible to carry out step d) before step c), so that the first radiation dose is used for partial cross-linking and the second dose for futher/full cross-linking of the dielectric material, as described in the preferred embodiment above.

Then, optionally a developing step d1) is carried out where any remaining dielectric material that has not been cross-linked in the previous steps is removed, e.g. by washing away with a solvent rinse.

In the next step e) source and drain electrodes (50) are deposited onto the gate insulator layer.

In the next step f) a layer of an organic semiconductor (OSC) material is deposited onto the source/drain electrodes (50) and the gate insulator layer, optionally followed by an annealing step. OSC crystals are formed mainly, preferably only, in those regions of the OSC layer (42) that are in contact with the regions of the insulator layer surface (32) where the dielectric material was fully exposed to the second radiation dosage in step d) and consequently has a higher cross-linking density. In the other regions (43) of the OSC layer, which are in contact with the source/drain electrodes (50), or with the regions (33) of the insulator layer not or only partially exposed to the second UV radiation dosage in step d) and having lower cross-linking density, the surface the OSC material is amorphous or less crystalline.

Figure 3B:
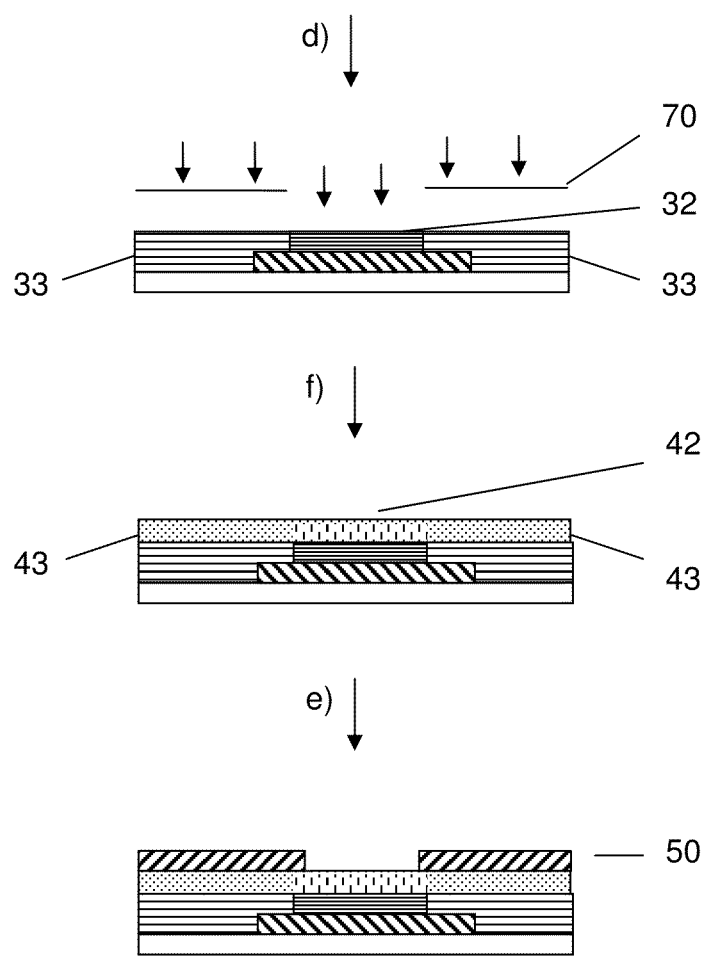
FIG. 3B exemplarily and schematically depicts a process for preparing a bottom gate, top contact OFET according to the present invention.

FIG. 3B exemplarily and schematically illustrates a process for preparing a bottom gate, top contact OFET device in accordance with the present invention. Steps a)-d) are carried out as described above for the process of FIG. 3A. In the next step f) a layer of OSC material is deposited onto the gate insulator layer, optionally followed by an annealing step. OSC crystals are formed mainly, preferably only, in those regions of the OSC layer (42) that are in contact with the regions of the insulator layer surface (32) where the dielectric material was fully exposed to the second radiation dosage in step d) and consequently has a higher cross-linking density. In the other regions (43) of the OSC layer, which are in contact with the regions (33) of the insulator layer not or only partially exposed to the second UV radiation dosage in step d) and having lower cross-linking density, the surface the OSC material is amorphous. In the next step e) source and drain electrodes (50) are then deposited onto the OSC layer (41, 42).

Optionally, in one or more further steps one or more further insulator or protective layers are provided onto the OSC layer (not shown in FIG. 3A and 3B).

In the process as described in FIG. 3A and 3B, the photo-radiation can also be replaced by thermal energy, and instead of a photomask a thermal laser can be used to heat only selected areas.

The process according to the present invention is not limited to OFETs, but can be used in the manufacture of any OE device where an OSC layer is deposited onto an insulator layer so as to be in direct contact with at least a part of the insulator layer. The skilled person can easily make modifications or changes to the process as described above and below, in order to use it for the manufacture of other OE devices. OFETs, in particular BG OFETs, however, are especially preferred.

For example, in another preferred embodiment of the present invention a TG OFET device is manufactured using the patterned insulator layer, which is preferably an OGI, as a substrate. By coating a glass substrate with a layer of the OGI, and subsequent patterning using the process described above, crystallisation of the OSC can be induced only in the channel region. As in the case of a BG OFET described above, the effect can be used to reduce the off-current of the OFET device when compared to a standard non-patterned process.

A preferred process of preparing a top gate OFET device comprises the following steps:

aa) An insulator layer containing the cross-linkable dielectric material is deposited on a substrate, e.g. a glass or plastic substrate, e.g. by coating or printing, bb) some, but not all areas of the insulator layer are exposed, e.g. through a mask, to a higher dosage of photoradiation that causes cross-linking of the dielectric material (thereby creating areas which will show crystallisation) while other areas are exposed to a lower dosage of said photoradiation, cc) source and drain electrodes are formed, with the channel region between the source and drain lying on top of the patterned area of the insulator layer, dd) a layer of an OSC material is deposited onto the insulator layer and the source and drain electrodes, e.g. by coating or printing, resulting in a high degree of crystallinity of the OSC in the patterned channel area and amorphous morphology or a lower degree of crystallinity in the other areas of the device, ee) an organic gate insulator (OGI) layer is deposited onto the source/drain and OSC layer. A preferred dielectric material for use in the gate insulator layer comprises or consists of a material with a low permittivity of between 1.5 and 3.3 at 1000 Hz and 20° C., like for example Cytop® 809 m available from Asahi Glass, ff) a gate electrode is formed on the OGI layer.

In the OE devices prepared by the process according to the present invention, the cross-linkable insulator layer is for example an OGI layer, but can also represent a dielectric interlayer that is provided between the OSC layer and other functional layers such as the OGI layer. Such an interlayer can also have additional functions, for example to promote or improve adhesion between the OGI and the OSC.

In a preferred embodiment of the present invention, the cross-linkable insulator layer is a gate insulator layer. In another preferred embodiment of the present invention, the cross-linkable insulator layer is an interlayer.

Thus, in another preferred process a gate insulator layer, for example comprising a conventional organic dielectric material, is deposited in a step b1) onto a substrate or onto a gate electrode as described above. In the next step b2), a second insulator layer comprising a cross-linkable dielectric material insulator is deposited onto the gate insulator layer, and subjected to the first and second radiation dosage as described above for steps c) and d). Source and drain electrodes and an OSC layer are then deposited onto the second insulator layer as described above for steps e) and f).

Especially preferred are the following embodiments:
the OE device is a BG, top contact OFET,
the OE device is a BG, bottom contact OFET,
the OE device is a TG OFET,
the insulator layer is a gate insulator layer or an interlayer,
the OSC layer comprises an optionally substituted polyacene and optionally comprises an organic binder,
the second radiation dosage is higher than the first radiation dosage,
the first radiation dosage is higher than the second radiation dosage,
the first radiation dosage is the same as the second radiation dosage,
the radiation is UV radiation, preferably with a wavelength in the range from 250 to 400 nm, more preferably from 300 to 400 nm,
the radiation is UVA radiation, preferably with a wavelength of 365 nm,
the radiation is UVB radiation, preferably with a wavelength ranging from 320 to 390 nm,
the radiation is UVC radiation, preferably with a wavelength of 254 nm,
the first and/or second radiation dosage is from 0.1 mJ/cm$^2$ to 15 J/cm$^2$, preferably from 0.1 to 5 J/cm$^2$, for a wavelength from 300 to 400 nm, depending on the cross-linkable material,
in the second exposure step the insulator layer is selectively protected by a patterned protective layer or a photomask or shadow mask, which prevents selected regions of the insulator at least partially from being exposed to the second radiation dosage,
in the first exposure step the insulator layer is selectively protected by a patterned protective layer or a photomask or shadow mask, which prevents selected regions of the insulator at least partially from being exposed to the first radiation dosage,
in the step wherein the insulator layer is exposed to the lower radiation dosage the insulator layer exposed to said radiation is unmasked (flood illumination), Thermally cross-linkable or dual UV/thermally cross-linkable dielectric materials can also be used. For thermally cross-linkable dielectric materials techniques such as laser curing can be used to achieve patterning. In the dual cross-linkable material the flood illumination step (either before of after the patterning step) can also be replaced by a thermal annealing step to achieve solvent resistance.

The material for preparing the insulator layer is preferably selected from photocross-linkable or thermally cross-linkable dielectric polymers such as polyvinyl cinnamates or polycycloolefins comprising cross-linkable moieties, like epoxy, maleimide, coumarin or indane groups. Suitable and preferred materials are for example Lisicon™D203 or Lisicon™D206 (commercially available from Merck KGaA, Darmstadt, Germany).

Preferably the deposition of individual functional layers in the process as described above and below, like the OSC layer and the insulator layer, is carried out using solution processing techniques. This can be done for example by applying a formulation, preferably a solution, comprising the OSC or dielectric material, respectively, and further comprising one or more organic solvents, onto the previously deposited layer, followed by evaporation of the solvent(s). Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating, or pad printing. Very preferred solution deposition techniques are spin coating, flexographic printing and inkjet printing.

Preferably the insulator layer is deposited by solution processing, very preferably using a solution of a cross-linkable material as described above and below in one or more organic solvents. Preferably the solvent used for depositing the dielectric material is orthogonal to the solvent used for depositing the OSC material, and vice versa.

Suitable solvents are selected from solvents including but not limited to hydrocarbon solvents, aromatic solvents, cycloaliphatic cyclic ethers, cyclic ethers, acetated, esters, lactones, ketones, amides, cyclic carbonates or multi-component mixtures of the above. Examples of preferred solvents include cyclohexanone, mesitylene, xylene, 2-heptanone, toluene, tetrahydrofuran, MEK, MAK (2-heptanone), cyclohexanone, 4-methylanisole, butyl-phenyl ether and cyclohexylbenzene, very preferably MAK, butyl phenyl ether or cyclohexylbenzene.

The total concentration of the respective functional material in the insulator formulation is from 0.1 to 30 wt. %, preferably from 1 to 5 wt. %.

In particular organic ketone solvents with a high boiling point are advantageous for use in solutions for inkjet and flexographic printing.

When spin coating is used as deposition method, the dielectric material is spun for example between 200 and 4000 rpm, preferably between 500 and 2000 rpm for a period of for example 30 seconds to give a layer with a typical layer thickness between 0.1 and 1.5 μm. After spin coating the film can be heated at an elevated temperature to remove all residual volatile solvents.

For cross-linking, the cross-linkable dielectric material after deposition is preferably exposed to electron beam or electromagnetic (actinic) radiation, like for example X-ray, UV, IR or visible radiation. For example, actinic radiation can used having a wavelength of from 50 nm to 700 nm, preferably from 200 to 450 nm, most preferably from 300 to 400 nm. Suitable radiation dosages are typically in the range from from 5 to 5,000 mJ/cm$^2$. Suitable radiation sources include mercury, mercury/xenon, mercury/halogen and xenon lamps, argon or xenon laser sources, x-ray, or e-beam. The exposure to actinic radiation will induce a cross-linking reaction in the cross-linkable groups of the dielectric material in the exposed regions. It is also possible for example to use a light source having a wavelength outside the absorption band of the cross-linkable groups, and to add a radiation sensitive photosensitizer to the cross-linkable material.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

All process steps described above and below can be carried out using known techniques and standard equipment which are described in prior art and are well-known to the skilled person. For example, in the photoirradiation step a commercially available UV lamp and photomask can be used, and the annealing step can be carried out in an oven or on a hot plate.

The thickness of a functional layer in an electronic device according to the present invention is preferably from 1 nm (in case of a monolayer) to 10 µm, very preferably from 1 nm to 1 µm, most preferably from 5 nm to 500 nm.

Various substrates may be used for the fabrication of organic electronic devices, for example glass or plastics, plastics materials being preferred, examples including alkyd resins, allyl esters, benzocyclobutenes, butadiene-styrene, cellulose, cellulose acetate, epoxide, epoxy polymers, ethylenechlorotrifluoro ethylene, ethylene-tetra-fluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, and silicones.

Preferred substrate materials are polyethyleneterephthalate, polyimide, and polyethylenenaphthalate. The substrate may be any plastic material, metal or glass coated with the above materials. The substrate should preferably be homogeneous to ensure good pattern definition. The substrate may also be uniformly pre-aligned by extruding, stretching, rubbing or by photochemical techniques to induce the orientation of the organic semiconductor in order to enhance carrier mobility.

The electrodes can be deposited by liquid coating, such as spray-, dip-, web- or spin-coating, or by vacuum deposition or vapor deposition methods. Suitable electrode materials and deposition methods are known to the person skilled in the art. Suitable electrode materials include, without limitation, inorganic or organic materials, or composites of the two. Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used deposited from a liquid phase.

The OSC materials and methods for applying the OSC layer can be selected from standard materials and methods known to the person skilled in the art, and are described in the literature.

In case of OFET devices, where the OFET layer is an OSC, it may be an n- or p- type OSC, which can be deposited by vacuum or vapor deposition, or preferably deposited from a solution. Preferred OSCs have a FET mobility of greater than $1 \times 10^{-5}$ cm$^2$V$^{-1}$s$^{-1}$.

The OSC is used for example as the active channel material in an OFET or a layer element of an organic rectifying diode. OSCs that are deposited by liquid coating to allow ambient processing are preferred. OSCs are preferably spray-, dip-, web- or spin-coated or deposited by any liquid coating technique. Ink-jet deposition is also suitable. The OSC may optionally be vacuum or vapor deposited.

The semiconducting channel may also be a composite of two or more of the same types of semiconductors. Furthermore, a p-type channel material may, for example be mixed with n-type materials for the effect of doping the layer. Multilayer semiconductor layers may also be used. For example the semiconductor may be intrinsic near the insulator interface and a highly doped region can additionally be coated next to the intrinsic layer.

The OSC may be a monomeric compound (also referred to as "small molecule", as compared to a polymer or macromolecule) or a polymeric compound, or a mixture, dispersion or blend containing one or more compounds selected from either or both of monomeric and polymeric compounds.

The OSC is a semicrystalline, crystalline or polycrystalline compound. Preferably the OSC is a monomeric compound, where it is easier to achieve a significant variation in the degree of crystallinity. Further preferred is a polymeric semicrystalline OSC material.

In case of monomeric materials, the OSC is preferably a conjugated aromatic molecule, and contains preferably at least three aromatic rings. Preferred monomeric OSCs contain 5, 6 or 7 membered aromatic rings, and more preferably contain 5 or 6 membered aromatic rings.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N(R$^3$)(R$^4$), where R$^3$ and R$^4$ each independently is H, optionally substituted alkyl, optionally substituted aryl, alkoxy or polyalkoxy groups. Where R$^3$ and R$^4$ is alkyl or aryl these may be optionally fluorinated.

The rings may be optionally fused or may be linked with a conjugated linking group such as —C(T$^1$)=C(T$^2$)—, —C≡C—, —N(R')—, —N=N—, (R')=N—, —N=C(R')—. T$^1$ and T$^2$ each independently represent H, Cl, F, —C≡N or lower alkyl groups particularly C$_{1-4}$ alkyl groups; R' represents H, optionally substituted alkyl or optionally substituted aryl. Where R' is alkyl or aryl these may be optionally fluorinated.

Further preferred OSC materials that can be used in this invention include compounds, oligomers and derivatives of compounds selected from the group comprising conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonapto-2,6-quinodimethane; α,α'-bis (dithieno[3,2-b2',3'-d]thiophene); 2,8-dialkyl, substituted dialkyl, diaryl or dialkynyl anthradithiophene; 2,2'-bibenzo[1,2-b:4,5-b']dithiophene. Preferred compounds are those from the above list and derivatives thereof which are soluble in organic solvents.

Especially preferred OSC materials are polymers or copolymers comprising one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further preferred OSC materials are are substituted oligoacenes such as pentacene, tetracene or anthracene, or heterocyclic derivatives thereof, like bis(trialkylsilylethynyl) oligoacenes or bis(trialkylsilylethynyl) heteroacenes, as disclosed for example in U.S. Pat. No. 6,690,029, WO 2005/055248 A1 or U.S. Pat. No. 7,385,221.

In another preferred embodiment of the present invention the OSC layer comprises one or more organic binders to adjust the rheological properties as described for example in WO 2005/055248 A1, in particular an organic binder which has a low permittivity, $\in$, at 1,000 Hz and 20° C. of 3.3 or less.

The binder is selected for example from poly(a-methylstyrene), polyvinylcinnamate, poly(4-vinylbiphenyl) or poly(4-methylstyrene, or blends thereof. The binder may also be a semiconducting binder selected for example from polyarylamines, polyfluorenes, polythiophenes, polyspirobifluorenes, substituted polyvinylenephenylenes, polycarbazoles or polystilbenes, or copolymers thereof.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

The following parameters are used:
μ is the charge carrier mobility
W is the length of the drain and source electrode (also known as "channel width")
L is the distance between the drain and source electrode (also known as "channel length")
$I_{DS}$ is the source-drain current
$C_i$ is the capacitance per unit area of the gate dielectric
$V_G$ is the gate voltage (in V)
$V_{DS}$ as is the source-drain voltage
$V_0$ is the offset voltage For the electrical characterisation the sample is placed in a probe station and connected via Suess PH100 probe heads to an Agilent 4155C semiconductor analyzer. Linear and saturation mobility is calculated at VD=−5V and VD=−60V respectively using the following equations:

$$\mu_{LIN} = -\frac{L}{W*Cox*VD} * \frac{\partial ID}{\partial VG}$$

$$\mu_{SAT} = \frac{2L}{W*Cox} * \frac{\partial sqrtID}{\partial VG}$$

wherein L and W are length and width of the channel, Cox=dielectric capacitance [F/cm$^2$], ID=drain current, sqrt ID=square root of absolute ID values, VG=gate voltage, VD=drain voltage.

Unless stated otherwise, all specific values of physical parameters like the permittivity ($\in$), charge carrier mobility (μ), solubility parameter (δ) and viscosity (η) as given above and below refer to a temperature of 20° C. (+/−1° C.). The molecular weight of oligomers and polymers means the weight average molecular weight $M_w$, which can be determined by GPC in a suitable solvent against polystyrene standards.

Example 1

Patterned BG OFET Device Using a High Dose UVB Treatment

A bottom gate OFET is prepared as follows and as illustrated by FIG. 3A: A substrate of Corning Eagle XG glass is sonicated in 3% Decon90 for 30min at 70° C., washed 2 times with water and sonicated in MeOH, then dried by spin off on the spin coater.

Aluminium gate electrodes of 30 nm thickness are evaporated onto the substrate (step a).

A dielectric layer of Lisicon™ D203 (available from Merck KGaA, Darmstadt, Germany) is spun onto the substrate (1500 rpm for 30 s) and heated on a hotplate for 1 min at 120° C. (step b).

The entire substrate is exposed to UVB irradiation between 320-390 nm for 30 seconds at a power of 0.1 W/cm$^2$ (total dose is 3 J/cm2) (step c).

The substrate is then exposed through a shadow mask to a second dose of UVB irradiation between 320-390 nm for 30 s at a power of 0.1 W/cm2 (step d). The areas exposed in this step are those in which crystallisation is required.

Silver source and drain electrodes are evaporated onto the dielectric layer creating devices with a channel L=50 μm and W=1000 μm. The substrate is treated with the surface treatment formulation Lisicon™ M001 (available from Merck KGaA, Darmstadt, Germany) for 1 min, washed with isopropyl alcohol and dried by spin off on the spin coater (step e).

The OSC Formulation Lisicon™ S1200 (available from Merck KGaA, Darmstadt, Germany) is spun onto the substrate after above treatment and then annealed for 1 min at 100° C. on a hotplate (step f). Optionally the device can be passivated as a final step.

Comparison Example 1

Unpatterned BG Device Using a High Dose UVB Treatment

A bottom gate OFET device is constructed in an identical fashion to that in Example 1, except that the shadow mask is not applied in step d, making the two exposure steps (c and d) identical, and thus equivalent to a single exposure of UVB irradiation for 60 s at a power of 0.1 W/cm$^2$.

Figure 4A:
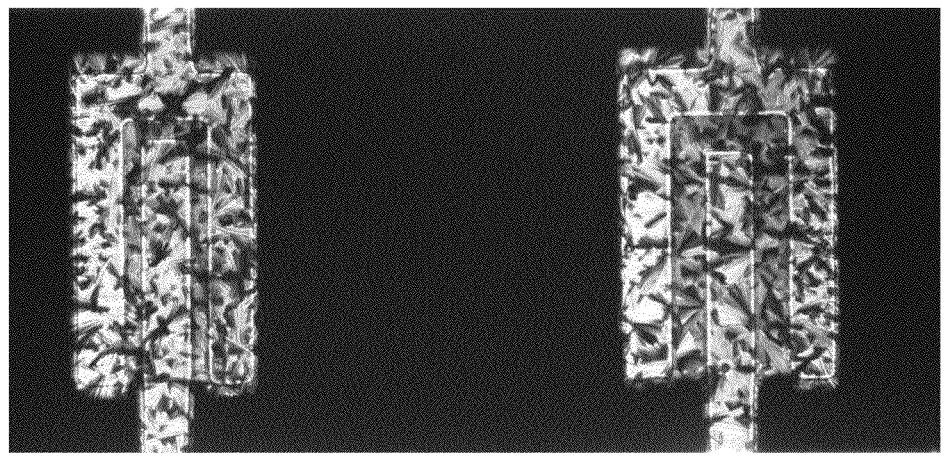
FIG. 4A shows a cross-polariser microscope photography of an OFET of Example 1.

FIG. 4A shows a patterned device prepared according to Example 1 and observed through a polarizing microscope. It can be seen that the areas which have received the increased UV dose show the formation of crystals, whereas the areas which have received the lower UV dosage show no crystal formation and appear black.

Figure 5A:
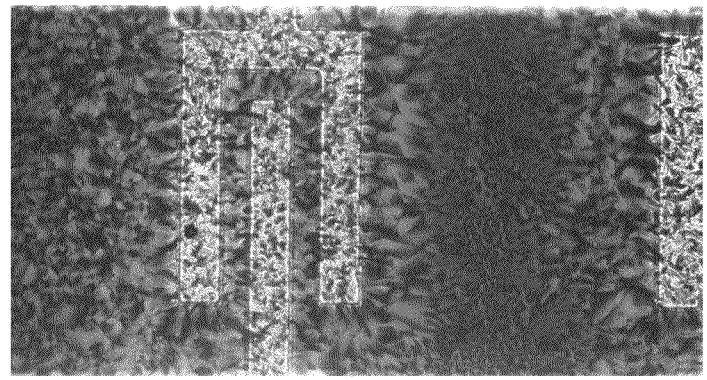
FIG. 5A shows cross-polariser microscope photography of an OFET of Comparison Example 1.

FIG. 5A illustrates a non patterned device prepared according to Comparison Example 1 and observed through a polarizing microscope, In this example there is no differentiation between the cross-linking density/UV dosage across the substrate, and hence the formation of crystals occurs over the entire substrate.

Figure 4B:
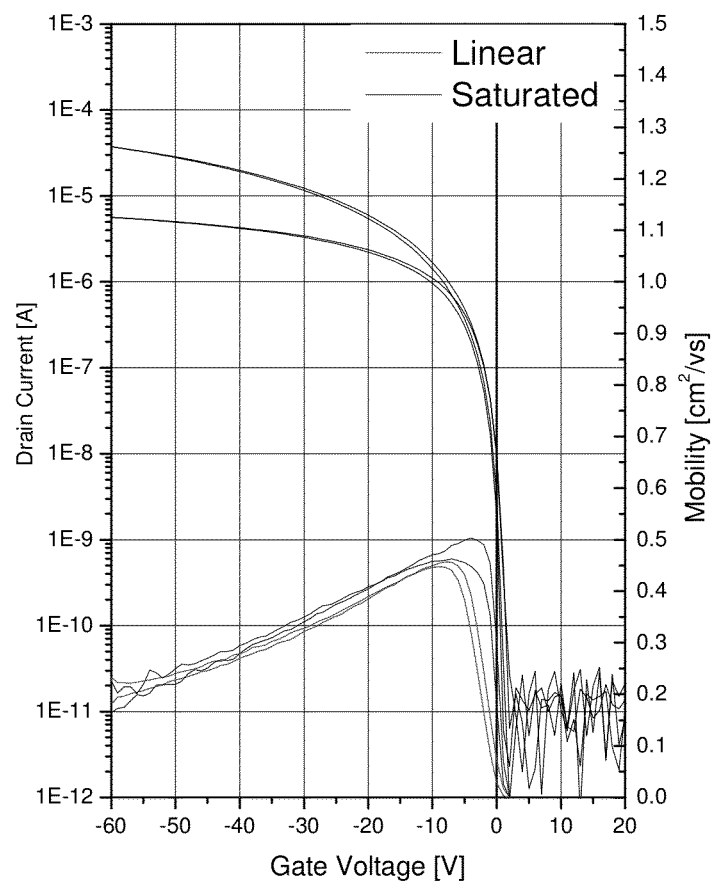
FIGS. 4B-4D show the transfer characteristics of an OFET of Example 1.
Figure 4C:
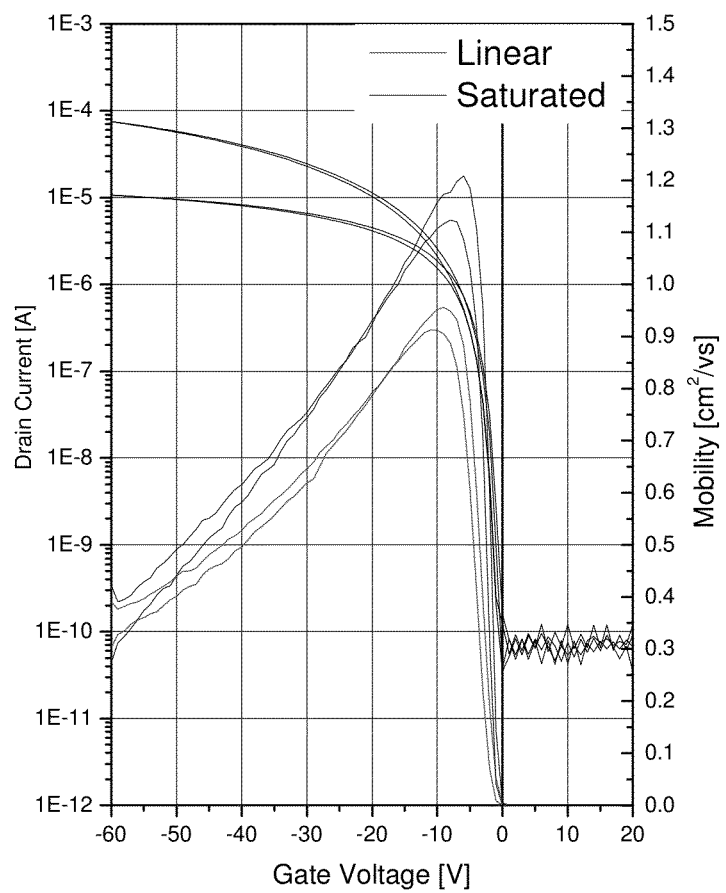
Figure 4D:
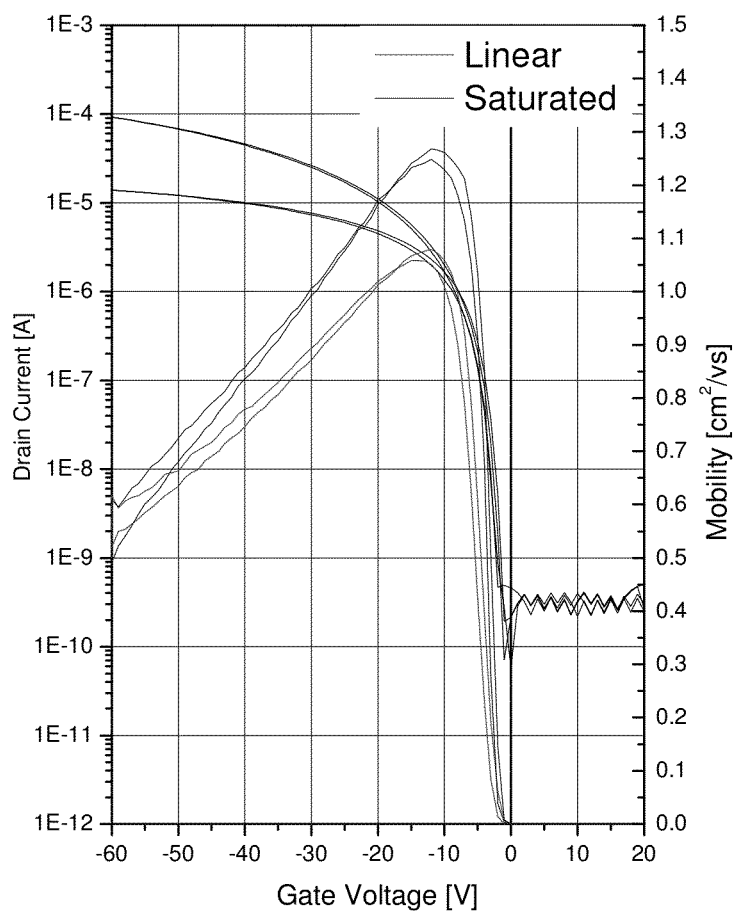
Figure 5B:
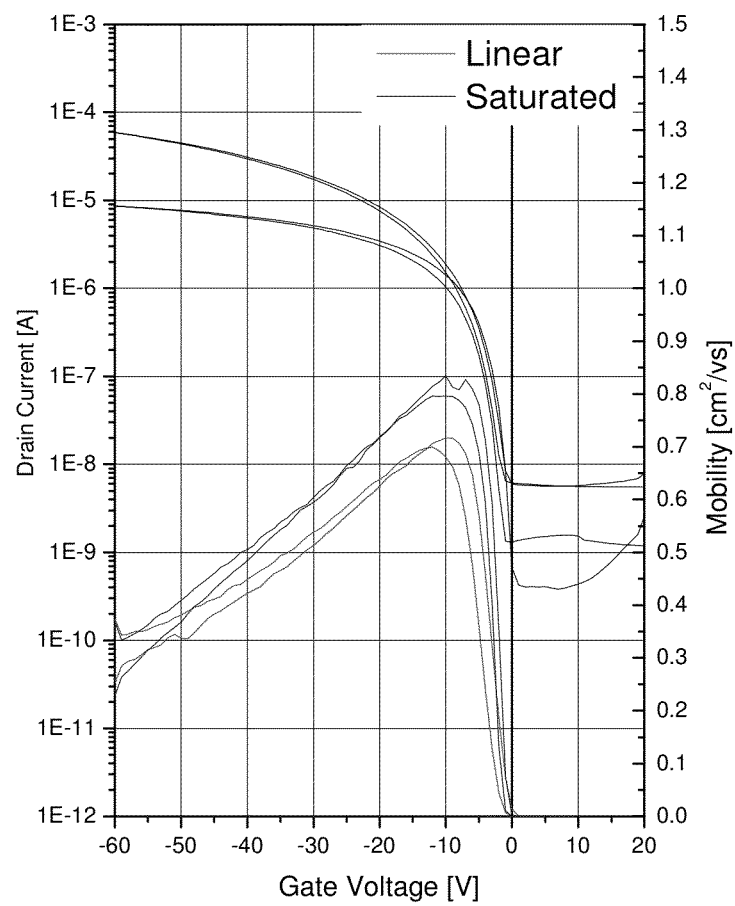
FIGS. 5B-5D show the transfer characteristics of an OFET of Comparison Example 1.
Figure 5C:
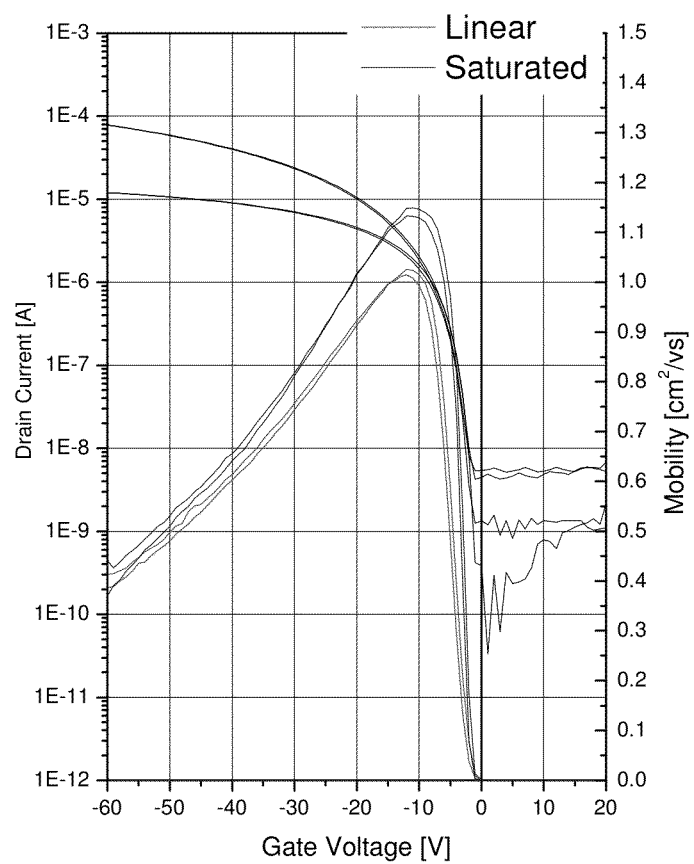
Figure 5D:
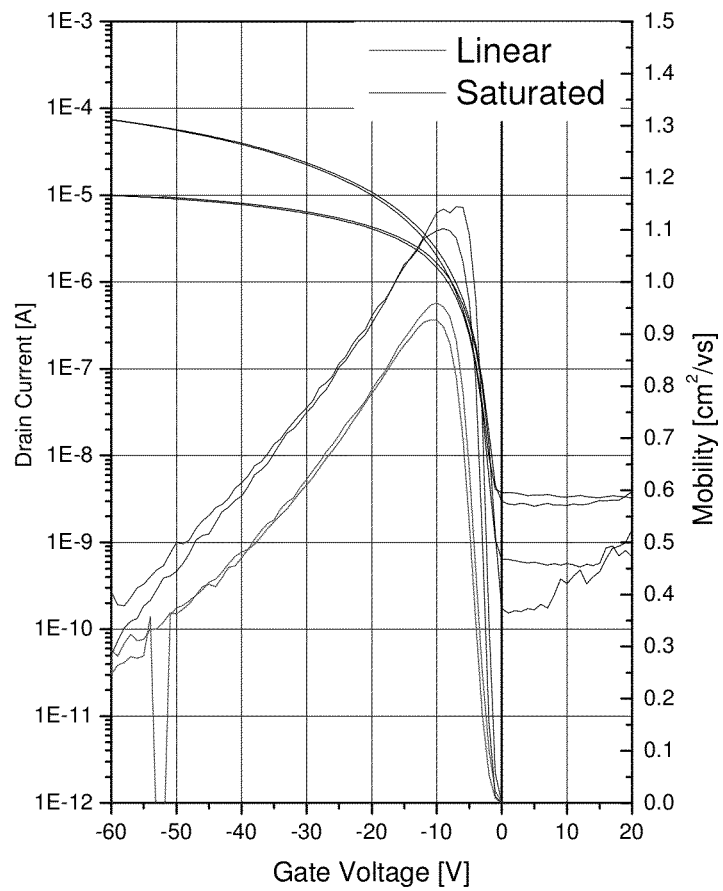

FIGS. 4B-D show the typical transistor performance of a patterned device prepared according to Example 1. FIGS. 5B-D show the typical transistor performance of a non-patterned device prepared according to Comparison Example 1. It can be clearly seen that the off currents measured in the patterned device are lower that that seen in the unpatterened device. This positive effect is seen at no significant detriment to the linear and saturated mobility values, or the value of the on current.

Example 2

Patterned BG OFET Device Using a Low Dose UVA Treatment

The bottom gate OFET device in this example is constructed in an identical fashion to that in Example 1, except that the dielectric layer material Lisicon™D203 is substituted by Lisicon™D206 in step b, the UV dose used in step c is UVA (365 nm) at a power of 0.01 W/cm$^2$ for 30 seconds (0.3 J/cm$^2$ dose), and the UV dose used in step d is UVA (365 nm) at a power of 0.01 W/cm$^2$ for 60 seconds (0.6 J/cm2 dose).

Figure 6:
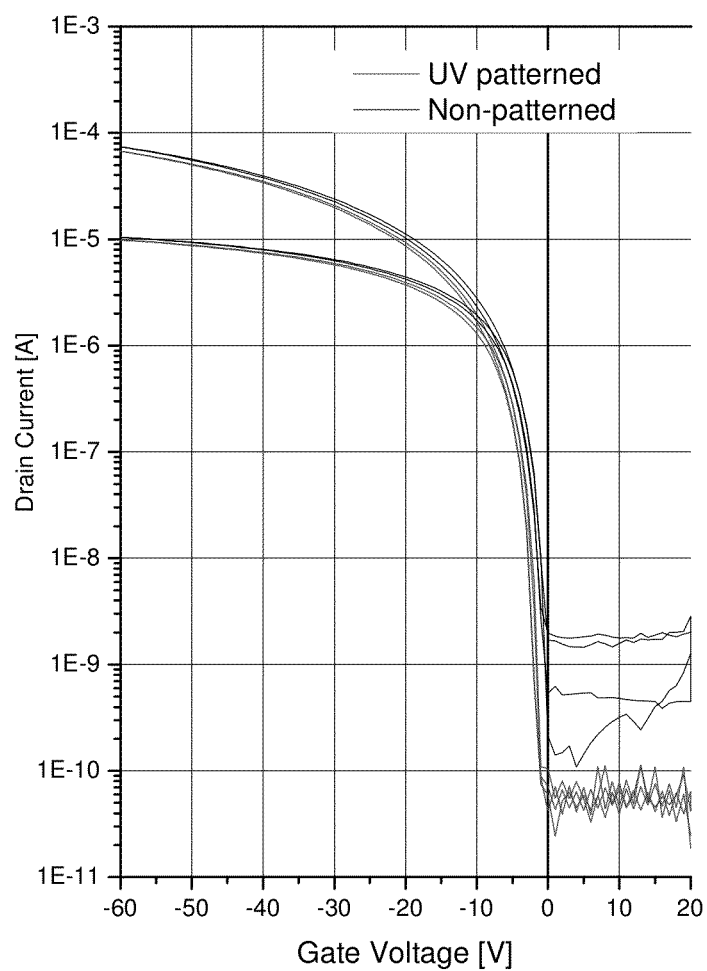
FIG. 6 shows the transfer characteristics of an OFET of Example 1 in comparison with an OFET of Comparison Example 1.

FIG. 6 shows the typical transistor performance of a device prepared by the method described in Example 2 with 365 nm UVA radiation, which has been fabricated in such a way to produce both patterned and unpatterened areas (half the substrate was irradiated without the use of a shadow mask). Measurement of the transistor characteristics shows the patterning to have an effect on reducing the off current to the detection limit of the apperatus. The unpatterned device shows a higher, and less stable value for the off current. There is no change in the measured on-current.

Example 3

Patterned TG OFET Device Using a High Dose UVA Dielectric as a Patternable Interlayer/Substrate A patterned top gate OFET device is prepared as follows. A substrate of Corning 1737 glass is sonicated in 3% Decon90 for 30 min at 70° C., washed 2 times with water and sonicated in MeOH, then dried by spin off on the spin coater. A dielectric layer of Lisicon™D203 (available from Merck KGaA, Darmstadt, Germany) is spun onto the substrate (1500 rpm for 30 s) and heated on a hotplate for 1 min at 120° C. (step aa).

The entire substrate is exposed to UVB irradiation between 320-390 nm for 30 seconds at a power of 0.1 W/cm$^2$ (total dose is 3 J/cm$^2$). The substrate is then exposed through a shadow mask to a second dose of UVB irradiation between 320-390 nm for 30 s at a power of 0.1 W/cm$^2$ (step bb). The areas exposed are those in which crystallisation is required.

Gold source and drain electrodes with 30 nm thickness are evaporated onto the substrate, onto the patterned interlayer creating a channel L=50 μm and W=1000 μm (step cc).

The substrate is treated with the surface treatment formulation Lisicon™ M001 (available from Merck KGaA, Darmstadt, Germany) for 1 min, washed with isopropyl alcohol and dried by spin off on the spin coater.

The OSC Formulation Lisicon™ S1200 (available from Merck KGaA, Darmstadt, Germany) is spun onto the substrate after the above treatment and then annealed for 1 min at 100° C. on a hotplate (step dd).

A dielectric layer of CYTOP™ (9% in FC-43, Asahi) is spun onto the cooled substrate (500 rpm for 10 s and 2000 rpm for 20 s) and heated on a hotplate for 2 min at 100° C. (step ee).

Then a 30 nm gold layer is evaporated onto the interlayer as the gate electrode (step ff).

Figure 7:
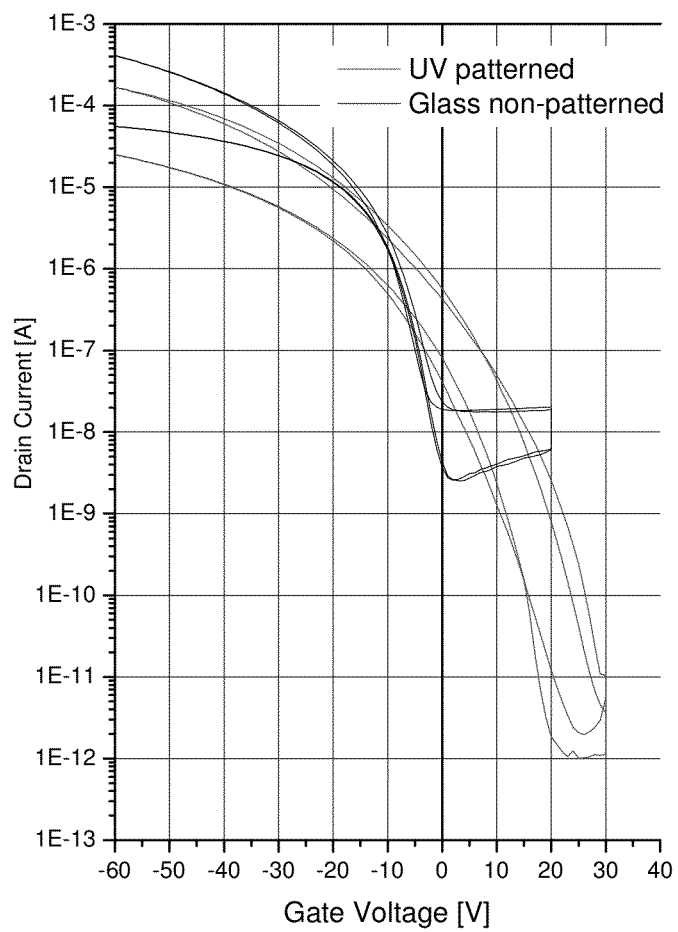
FIG. 7 shows the transfer characteristics of an OFET of Example 3.

FIG. 7 illustrates the greatly improved off-current when a patterned TG device is produced. The comparative device is a standard top gate device, prepared on a cleaned glass substrate with no patterning interlayer, onto which the S/D electrodes were thermally evaporated.

The invention claimed is:

1. A process for preparing an organic electronic (OE) device, comprising the steps of
    depositing an insulator layer comprising a cross-linkable dielectric material onto a substrate or onto another layer of said OE device,
    exposing one or more areas of the insulator layer to a first radiation dosage, or to a first thermal energy, that causes partial but not complete cross-linking of the dielectric material, wherein the cross-linking is sufficient to provide solvent resistance,
    exposing one or more, but not all, areas of the insulator layer to a second radiation dosage, or to a second thermal energy, that causes a higher degree of cross-linking of the dielectric material than the exposure to the first radiation dosage or the first thermal energy,
    depositing an organic semiconductor (OSC) layer onto at least a part of the insulator layer,
    so that the OSC layer is in direct contact with at least a part of the areas of the insulator layer having a higher degree of cross-linking of the dielectric material.

2. The process according to claim 1, characterized in that it comprises, after the first and second exposure steps, the step of removing any remaining dielectric material that was not cross-linked in the previous steps.

3. The process according to claim 1, characterized in that it comprises the following steps
    a) depositing a gate electrode onto a substrate,
    b) depositing the insulator layer comprising a cross-linkable dielectric material onto the gate electrode and/or the substrate,
    c) depositing source and drain electrodes onto the insulator layer,
    d) depositing the OSC layer onto the source and drain electrodes and the insulator layer, and wherein the area between the source electrode and the drain electrode is the channel area, and the OSC layer is in direct contact with the insulator layer at least in the channel area or at least in an area that is entirely superposed by the channel area.

4. The process according to claim 3, characterized in that the area(s) of the insulator layer that are exposed to a second radiation dosage or second thermal energy include the area which is superposed to the channel area, and include those areas which are superposed to the source electrode or the drain electrode.

5. The process according to claim 1, characterized in that it comprises the following steps
   aa) wherein the first exposing step includes some, but not all areas of the insulator layer being exposed to a higher dosage of photoradiation that causes cross-linking of the dielectric material, and other areas being exposed to a lower dosage of said photoradiation, and
   bb) forming source and drain electrodes with the channel region between the source and drain lying on top of the patterned area of the insulator layer,
   cc) depositing the layer of an OSC material onto the insulator layer and the source and drain electrodes,
   dd) depositing an organic gate insulator (OGI) layer onto the OSC layer, and
   ee) forming a gate electrode on the OGI layer.

6. The process according to claim 1, characterized in that the radiation is UV radiation.

7. The process according to claim 1, characterized in that the second radiation dosage is the same as or higher than the first radiation dosage.

8. The process according to claim 1, characterized in that in the second exposure step the insulator layer is selectively protected by a patterned protective layer, a photomask or a shadow mask, which prevents selected areas of the insulator at least partially from being exposed to the second radiation dosage.

9. The process according to claim 1, characterized in that the insulator layer is a gate insulator layer or an interlayer.

10. The process according to claim 1, characterized in that the insulator layer comprises a cross-linkable dielectric material selected from photocross-linkable or thermally cross-linkable dielectric polymers, polyvinyl cinnamates or polycycloolefins comprising cross-linkable moieties.

11. The process according to claim 1, characterized in that the organic semiconductor layer comprises a substituted polyacene.

12. The process according to claim 2, wherein the step of removing any dielectric material includes using a solvent rinse.

13. The process according to claim 3, further comprising patterning the insulator layer to leave areas that contain cross-linked dielectric material and areas that do not contain cross-linked dielectric material, wherein the degree of cross-linking of the dielectric material is sufficient to provide solvent resistance.

14. The process according to claim 13, wherein the patterning step includes, exposing the insulator layer to photoradiation through a photomask or shadow mask or by exposing the insulator layer to thermal energy using a thermal laser to heat only selected areas.

15. The process according to claim 3, wherein the depositing the insulator layer step includes annealing the dielectric material.

16. The process according to claim 3, wherein the depositing the OSC layer includes annealing the OSC layer.

17. The process according to claim 3, further comprising removing any remaining dielectric material that was not cross-linked in the previous steps.

18. The process according to claim 17, wherein the removing any remaining dielectric material step includes using a solvent rinse.

19. The process according to claim 10, wherein the cross-linkable moieties include epoxy, maleimide, coumarin or indane moieties.

20. The process according to claim 11, wherein the OSC layer further comprises an organic binder.

21. An electronic device obtained by a process according to claim 1.

22. The electronic device according to claim 21, characterized in that it is a top gate or bottom gate organic field effect transistor.

* * * * *